(12) United States Patent
Kam et al.

(10) Patent No.: US 10,720,441 B2
(45) Date of Patent: Jul. 21, 2020

(54) THREE-DIMENSIONAL SEMICONDUCTOR MEMORY DEVICE

(71) Applicant: SAMSUNG ELECTRONICS CO., LTD., Suwon-si (KR)

(72) Inventors: Hee-Sung Kam, Anyang-si (KR); TaeHee Lee, Seoul (KR); Kyoung-Hoon Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/988,745

(22) Filed: May 24, 2018

(65) Prior Publication Data

US 2019/0157291 A1 May 23, 2019

(30) Foreign Application Priority Data

Nov. 21, 2017 (KR) .......................... 10-2017-0155876

(51) Int. Cl.
| | |
|---|---|
| H01L 21/82 | (2006.01) |
| H01L 27/11582 | (2017.01) |
| G11C 16/08 | (2006.01) |
| H01L 27/11573 | (2017.01) |
| H01L 27/1157 | (2017.01) |
| H01L 27/11565 | (2017.01) |
| G11C 16/04 | (2006.01) |

(52) U.S. Cl.
CPC ........ *H01L 27/11582* (2013.01); *G11C 16/08* (2013.01); *H01L 27/1157* (2013.01); *H01L 27/11565* (2013.01); *H01L 27/11573* (2013.01); *G11C 16/0483* (2013.01)

(58) Field of Classification Search
CPC ......... H01L 27/11582; H01L 27/11573; H01L 27/1157; H01L 27/11565; G11C 16/08; G11C 16/0483

See application file for complete search history.

(56) References Cited

U.S. PATENT DOCUMENTS

| | | | |
|---|---|---|---|
| 8,592,890 | B2 | 11/2013 | Watanabe et al. |
| 9,184,060 | B1 | 11/2015 | Lee |
| 9,786,676 | B2 | 10/2017 | Yun et al. |
| 9,806,093 | B2 | 10/2017 | Toyama et al. |
| 9,893,074 | B2 | 2/2018 | Lee et al. |

(Continued)

FOREIGN PATENT DOCUMENTS

KR 10-2016-0058031 A 5/2016

*Primary Examiner* — Moin M Rahman
(74) *Attorney, Agent, or Firm* — Sughrue Mion, PLLC

(57) ABSTRACT

Provided is a three-dimensional semiconductor memory device. The device may include a substrate that includes a cell array region and a connection region; an electrode structure provided on the substrate to extend in a first direction and include electrodes that are vertically stacked on the substrate and include pad portions which are stacked on the connection region to have a staircase structure; cell vertical structures provided on the cell array region to penetrate the electrode structure; dummy vertical structures provided on the connection region to penetrate the pad portion of each electrode; and cell contact plugs coupled to the pad portions of the electrodes. Each cell contact plug may have a non-circular top surface, and the dummy vertical structures may be arranged to surround each cell contact plug, in a plan view.

20 Claims, 16 Drawing Sheets

(56) References Cited

U.S. PATENT DOCUMENTS

| | | |
|---|---|---|
| 2012/0061743 A1 | 3/2012 | Watanabe et al. |
| 2014/0162420 A1* | 6/2014 | Oh .................. H01L 27/11565 438/270 |
| 2015/0340376 A1* | 11/2015 | Park ................ H01L 27/11582 257/329 |
| 2015/0372101 A1 | 12/2015 | Lee et al. |
| 2016/0225785 A1* | 8/2016 | Kim ................ H01L 27/11575 |
| 2017/0062473 A1 | 3/2017 | Lee et al. |
| 2017/0133389 A1 | 5/2017 | Yun et al. |
| 2017/0170191 A1 | 6/2017 | Lee et al. |
| 2017/0179152 A1 | 6/2017 | Toyama et al. |

* cited by examiner

THREE-DIMENSIONAL SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2017-0155876, filed on Nov. 21, 2017, in the Korean Intellectual Property Office, the disclosure of which is hereby incorporated by reference in its entirety.

BACKGROUND

Exemplary embodiments relate to a three-dimensional semiconductor memory device, and in particular, to a highly-reliable, highly-integrated three-dimensional semiconductor memory device.

Higher integration of semiconductor devices is required to satisfy consumer demands for superior performance and inexpensive prices. In the case of semiconductor devices, since their integration is an important factor in determining product prices, increased integration is especially important. In the case of conventional two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. To overcome such a limitation, there have been recently proposed three-dimensional semiconductor memory devices that include three-dimensionally arranged memory cells.

SUMMARY

Some embodiments of the present inventive concept provide a highly-reliable, highly-integrated three-dimensional semiconductor memory device.

According to some embodiments, a three-dimensional semiconductor memory device may include a substrate that includes a cell array region and a connection region, an electrode structure provided on the substrate to extend in a first direction and to include electrodes that are vertically stacked on the substrate, each of the electrodes including a respective pad portion from among a plurality of pad portions, which are stacked on the connection region to form a staircase structure, a plurality of cell vertical structures provided on the cell array region and configured to penetrate the electrode structure, a plurality of dummy vertical structures provided on the connection region and configured to penetrate the respective pad portion of each of the electrodes, and cell contact plugs that are respectively coupled to the pad portions of the electrodes. A top surface of each of the cell contact plugs may have a first length and a first width that is less than the first length, and the dummy vertical structures may be arranged to surround each of the cell contact plugs, when viewed in a plan view.

According to some embodiments, a three-dimensional semiconductor memory device may include a substrate that includes a cell array region and a connection region, an electrode structure provided on the substrate to extend in a first direction and to include electrodes that are vertically stacked on the substrate, each of the electrodes including a respective pad portion from among a plurality of pad portions, which are stacked on the connection region to form a staircase structure, a plurality of cell vertical structures provided on the cell array region and configured to penetrate the electrode structure, cell contact plugs respectively coupled to the pad portions of the electrodes, a top surface of each of the cell contact plugs having a first length and a second width that is less than the first length, and a plurality of dummy vertical structures provided on the connection region and configured to penetrate the pad portion of each of the electrodes and to surround each of the cell contact plugs. The dummy vertical structures may include a first dummy vertical structure, which is spaced apart from the cell array region by a first distance, and a second dummy vertical structure, which is spaced apart from the cell array region by a second distance that larger than the first distance, and a width of the second dummy vertical structure may be larger than that of the first dummy vertical structure.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are illustrated.

Figure 1:
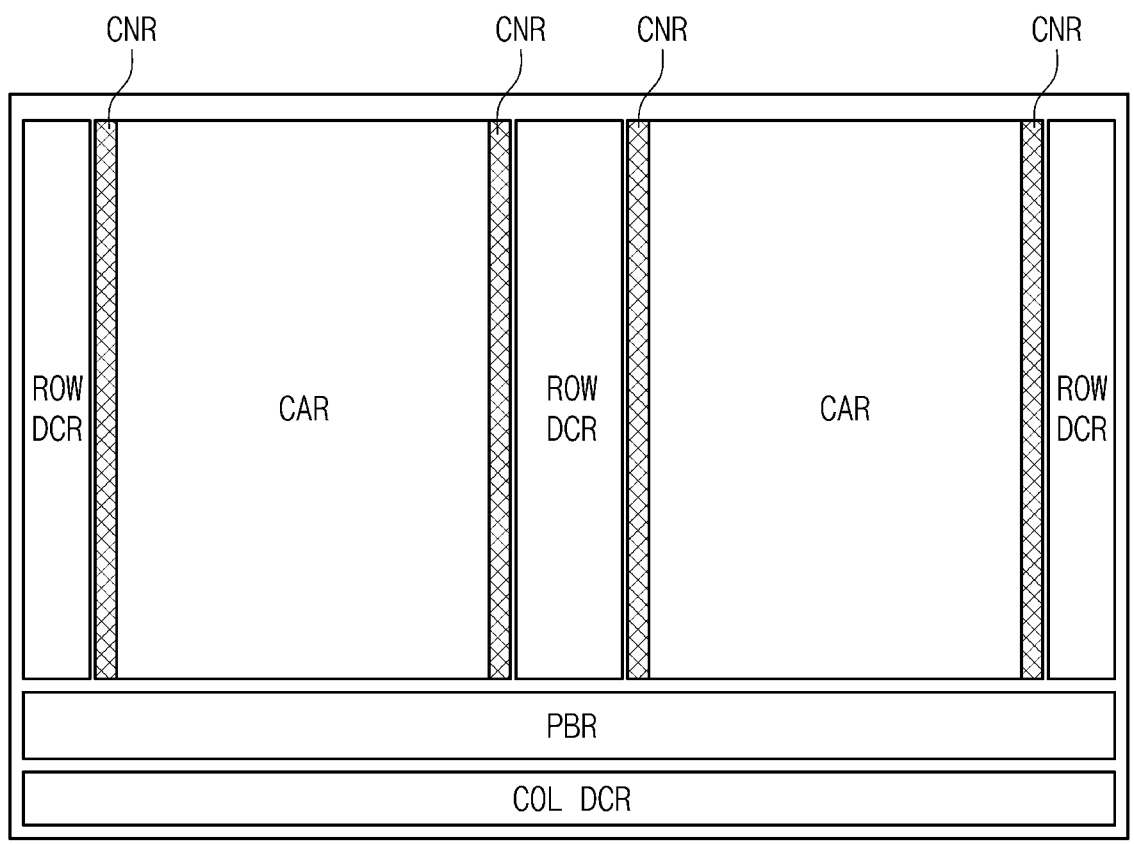
FIG. 1 is a diagram schematically illustrating a layout of a three-dimensional semiconductor memory device, according to some embodiments.

FIG. 1 is a diagram schematically illustrating a layout of a three-dimensional semiconductor memory device, according to some embodiments.

Referring to FIG. 1, a three-dimensional semiconductor memory device may include a cell array region CAR and a peripheral circuit region. The peripheral circuit region may include row decoder regions ROW DCR, a page buffer region PBR, a column decoder region COL DCR, and a control circuit region (not shown). In some embodiments, a respective connection region CNR may be provided between the cell array region CAR and each of the row decoder regions ROW DCR.

A memory cell array that includes a plurality of memory cells may be provided in the cell array region CAR. In some embodiments, the memory cell array may include a plurality of memory blocks, each of which is configured to independently perform an erase operation. Each of the memory blocks may include a plurality of memory cells, which are three-dimensionally arranged in the memory cell array; a plurality of word lines, which are electrically connected to the memory cells; and a plurality of bit lines, which are also electrically connected to the memory cells.

In some embodiments, the three-dimensional semiconductor memory device may be a vertical-type NAND FLASH memory device that includes a plurality of cell strings provided on the cell array region CAR. In this aspect, the cell strings may be two-dimensionally arranged in first and second directions and may be extended in a third direction. Each of the cell strings may include a plurality of series-connected transistors (e.g., string selection transistors, memory cell transistors, and a ground selection transistor). Furthermore, each of the memory cell transistors may include a data storage element.

In the connection region CNR, an interconnection structure (e.g., contact plugs and conductive lines) may be provided to electrically connect the memory cell array to the row decoder.

In each of the row decoder regions ROW DCR, a row decoder may be provided and configured to select at least one of the word lines that are provided in the memory cell array. The row decoder may be configured to select at least one of the word lines, based on address information. The row decoder may be configured to apply different word line voltages to selected and unselected ones, respectively, of the word lines, in response to control signals received from a control circuit (not shown).

In the page buffer region PBR, a page buffer may be provided and configured to read out data stored in the memory cells. In a first operation mode, the page buffer may be used to temporarily store data in the memory cells, and in a second operation mode, the page buffer may be used to read out data stored in the memory cells. For example, the page buffer may function as a write driver in a program operation mode or as a sense amplifier in a read operation mode.

A column decoder may be provided in the column decoder region COL DCR and may be connected to the bit lines of the memory cell array. The column decoder may provide data-transmission paths between the page buffer and an external device (e.g., a memory controller).

Figure 2:
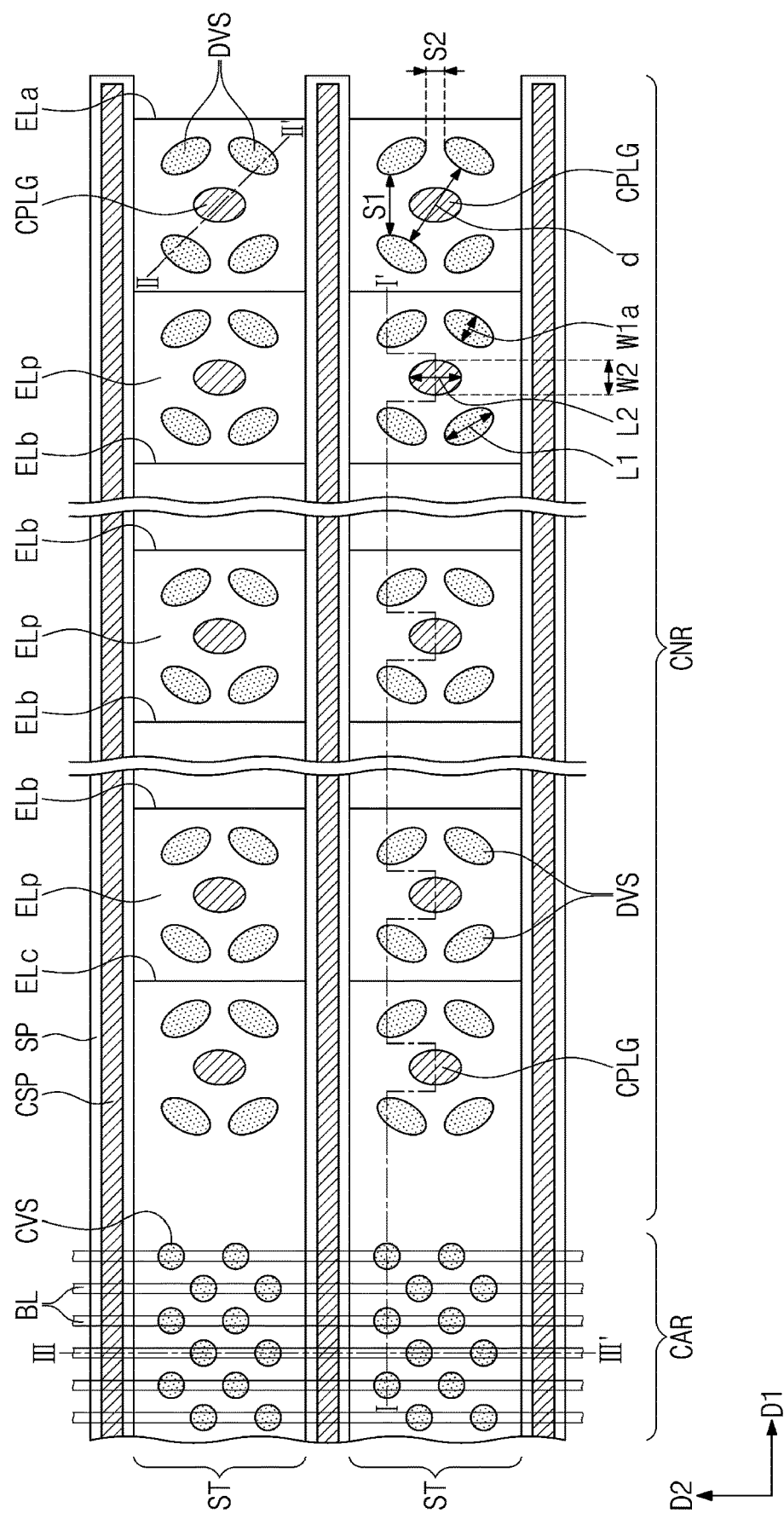
FIG. 2 is a plan view illustrating a three-dimensional semiconductor memory device, according to some embodiments.
Figure 3:
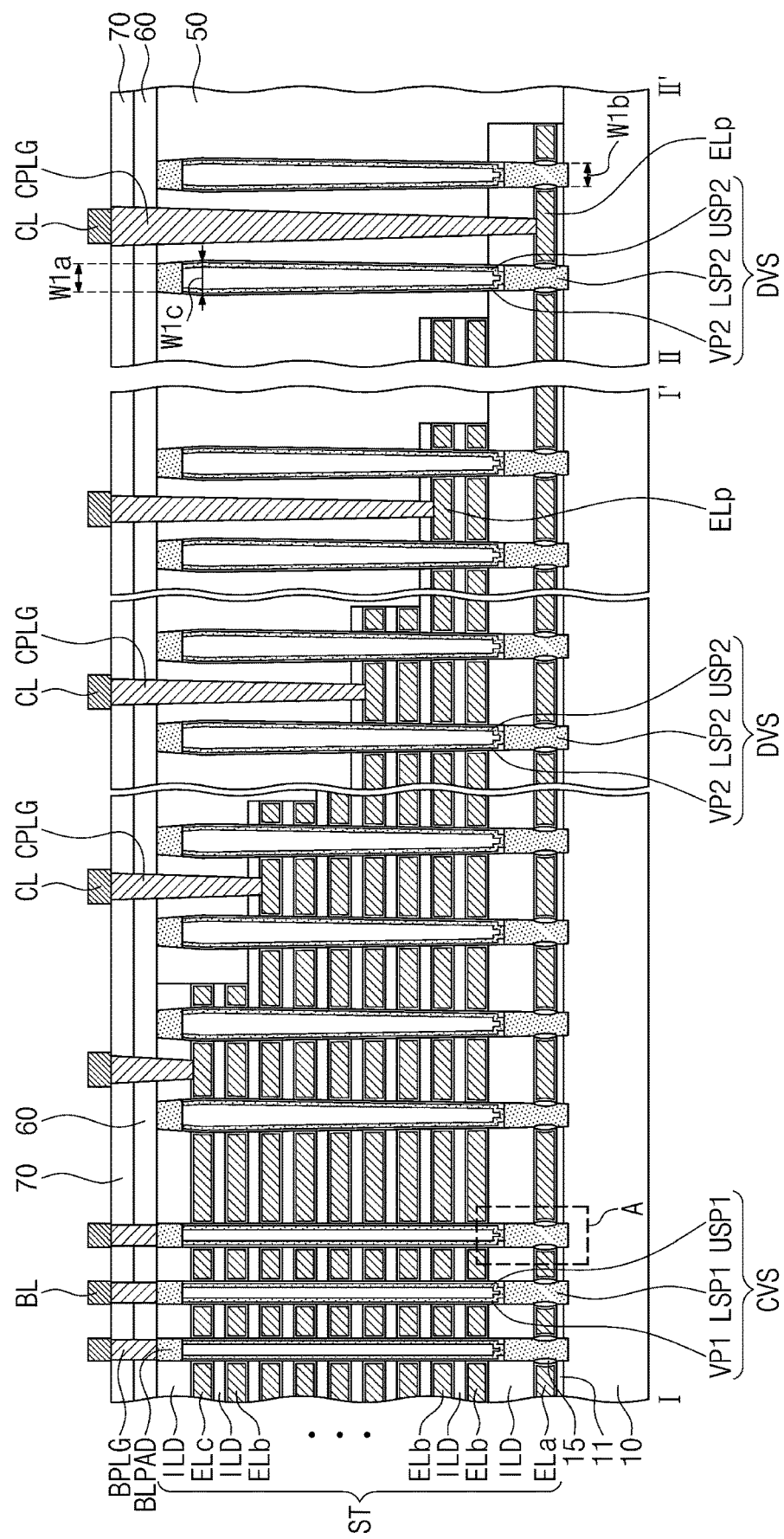
FIG. 3 is a sectional view illustrating a three-dimensional semiconductor memory device, according to some embodiments, taken along lines I-I' and II-II' of FIG. 2.
Figure 4:
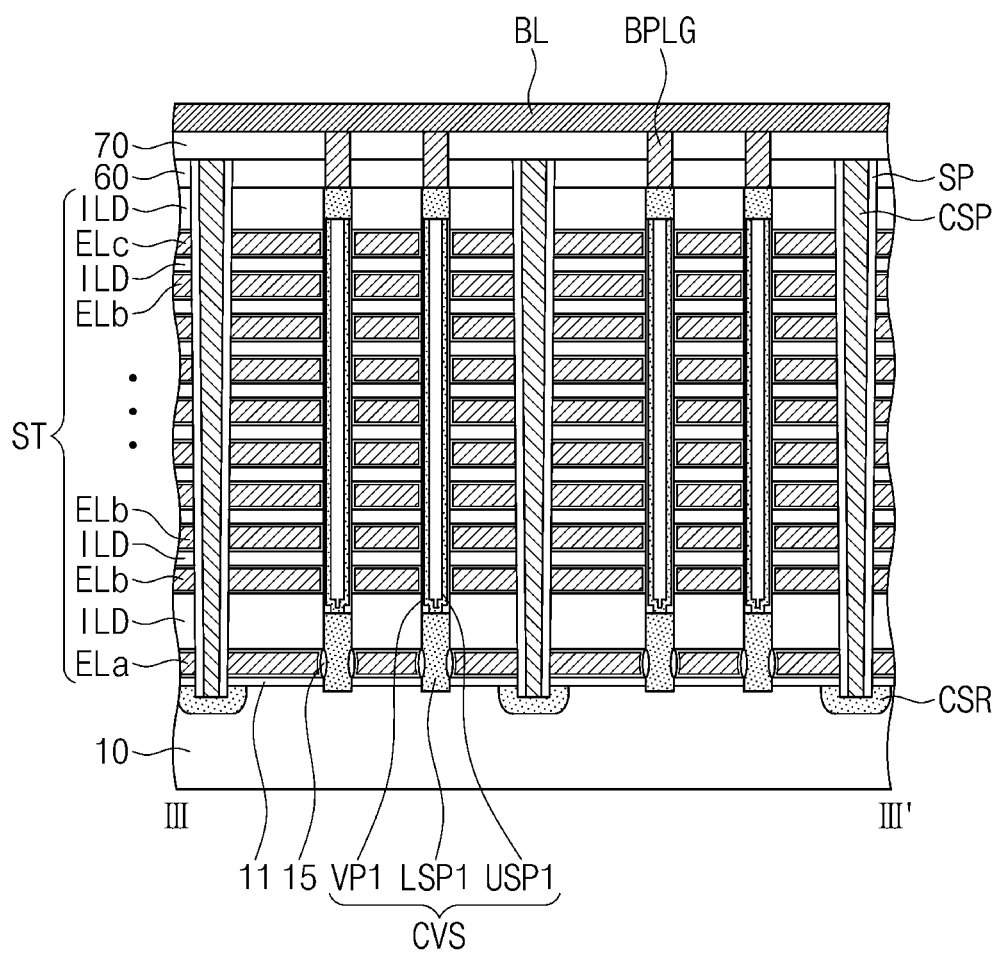
FIG. 4 is a sectional view illustrating a three-dimensional semiconductor memory device, according to some embodiments, taken along line III-III' of FIG. 2.
Figure 5A:
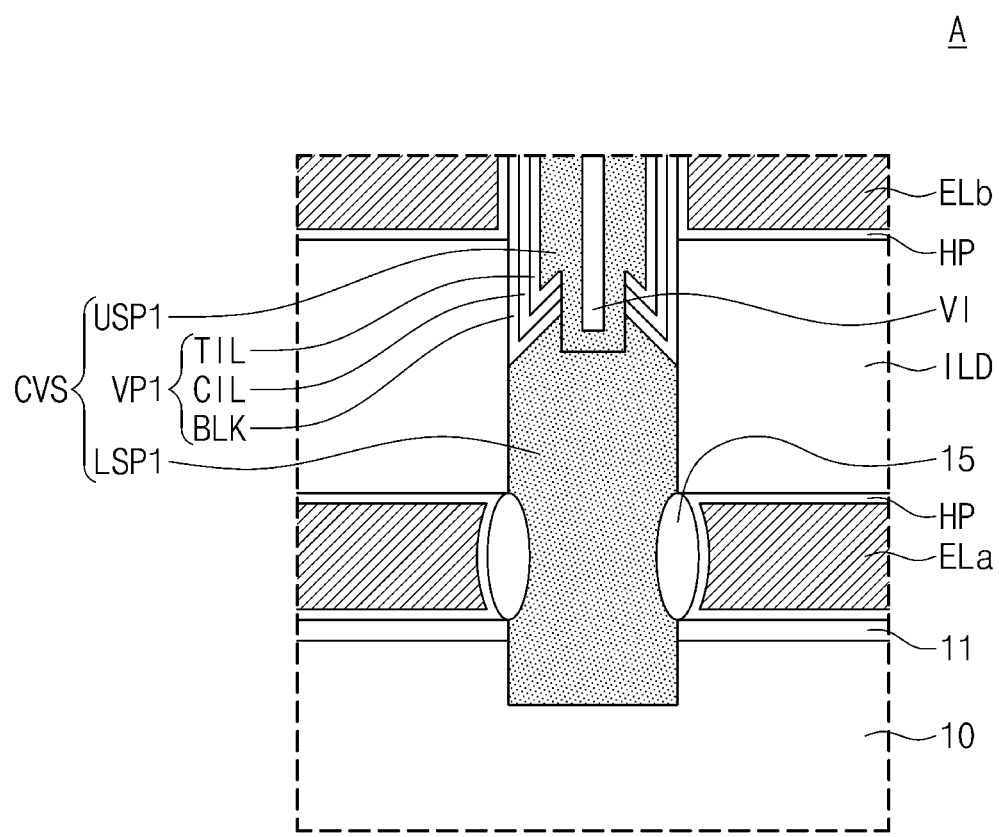
FIGS. 5A and 5B are enlarged views illustrating a portion 'A' of FIG. 3.
Figure 5B:
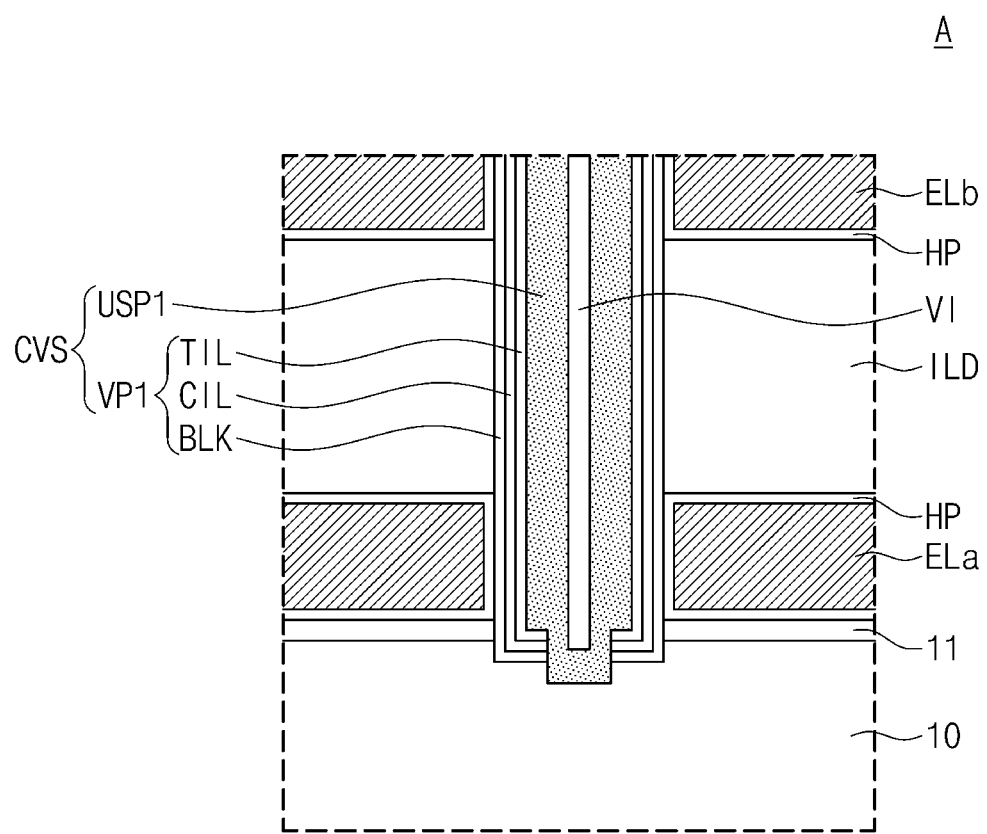

FIG. 2 is a plan view illustrating a three-dimensional semiconductor memory device, according to some embodiments. FIG. 3 is a sectional view illustrating a three-dimensional semiconductor memory device, according to some embodiments, taken along lines I-I' and II-II' of FIG. 2. FIG. 4 is a sectional view illustrating a three-dimensional semiconductor memory device, according to some embodiments, taken along line III-III' of FIG. 2. FIGS. 5A and 5B are enlarged views illustrating a portion 'A' of FIG. 3.

Referring to FIGS. 2, 3, and 4, a substrate 10 may include a cell array region CAR and a connection region CNR. The substrate 10 may include at least one of a semiconductor material (e.g., silicon), an insulating material (e.g., glass), and a semiconductor material or a conductive material covered with an insulating material. For example, the substrate 10 may be a silicon wafer, which is of a first conductivity type.

Electrode structures ST may be provided on the substrate 10 to extend from the cell array region CAR to the connection region CNR in a first direction D1 and may be spaced apart from each other in a second direction D2. A buffer insulating layer 11 may be interposed between the electrode structure ST and the substrate 10 and may include a silicon oxide layer.

The electrode structure ST may include electrodes ELa, ELb, and ELc and insulating layers ILD, which are alternately and repeatedly stacked on a top surface of the substrate 10 in a third direction that is normal with respect to the top surface. The electrodes ELa, ELb, and ELc may be provided to have substantially the same thickness, and thicknesses of the insulating layers ILD may vary based on the type of the semiconductor memory device. A thickness of each of the insulating layers ILD may be less than that of each of the electrodes ELa, ELb, and ELc. The electrodes ELa, ELb, and ELc may be formed of or include at least one of doped semiconductor materials (e.g., doped silicon and so forth), metals (e.g., tungsten, copper, aluminum, and so forth), conductive metal nitrides (e.g., titanium nitride, tantalum nitride, and so forth), and/or transition metals (e.g., titanium, tantalum, and so forth). The insulating layers ILD may be formed of or include at least one of silicon oxide and/or low-k dielectric materials.

In some embodiments, each of the electrode structures ST may include a lower electrode ELa located at the lowermost level, an upper electrode ELc located at the uppermost level, and intermediate electrodes ELb vertically stacked between the lower and upper electrodes ELa and ELc.

The electrode structure ST may have a staircase structure on the connection region CNR. In detail, lengths of the electrodes ELa, ELb, and ELc in the first direction D1 may decrease with increasing distance from the substrate 10, and a height of the electrode structure ST may decrease with increasing distance from the cell array region CAR. Side surfaces of the electrodes ELa, ELb, and ELc may be spaced apart from each other, by a constant distance, in the first direction D1.

The electrode structure ST may be formed to have various types of staircase structures on the connection region CNR. Although the electrode structure ST is illustrated to have a staircase structure whose height decreases in a stepwise manner in the first direction D1, the electrode structure ST may have a staircase structure whose height is decreased in both of the first and second directions D1 and D2, on the connection region CNR.

Each of the electrodes ELa, ELb, and ELc may have a pad portion ELp on the connection region CNR, and the staircase structure of each of the electrode structures ST may vary based on the arrangement of the pad portions ELp of the electrodes ELa, ELb, and ELc. In some embodiments, the pad portions ELp of odd-numbered ones of the electrodes ELa, ELb, and ELc may be located at different positions in horizontal and vertical directions. The pad portions ELp of the odd-numbered ones of the electrodes ELa, ELb, and ELc may veil the pad portions ELp of even-numbered ones of the electrodes located thereunder. In certain embodiments, the pad portions ELp of all of the electrodes ELa, ELb, and ELc may be located at different positions in the horizontal and vertical directions.

A planarized insulating layer 50 may be provided to cover end portions of the electrode structures ST, which are formed to have the staircase structure. For example, the planarized insulating layer 50 may be provided to cover the pad portions ELp of the electrodes ELa, ELb, and ELc. The planarized insulating layer 50 may have a substantially flat top surface. The planarized insulating layer 50 may include a single insulating layer or a plurality of stacked insulating layers.

A plurality of cell vertical structures CVS may be provided on the cell array region CAR and configured to penetrate the electrode structure ST, and may be connected to the substrate 10. The cell vertical structures CVS may be arranged in a row or in a zigzag manner, when viewed in a plan view. The cell vertical structures CVS may have circular top surfaces, and a width or a diameter of the cell vertical structure CVS may be less than minor axis width of a dummy vertical structure DVS.

The cell vertical structures CVS may include a semiconductor material (e.g., silicon (Si), germanium (Ge), or mixtures thereof). In certain embodiments, the cell vertical structures CVS may be formed of or include a doped semiconductor material or an intrinsic semiconductor material. In the vertical-type NAND FLASH memory device, the cell vertical structures CVS that include the semiconductor material may be used as channel regions of the ground and string selection transistors and the memory cell transistors constituting the cell string.

Each of the cell vertical structures CVS may include a first lower semiconductor pattern LSP1, a first upper semiconductor pattern USP1, and a first vertical insulating pattern VP1. A bit line contact pad BLPAD may be provided on a top portion of the first upper semiconductor pattern USP1. In some embodiments, the bit line contact pad BLPAD may be formed of or include a doped semiconductor material, but the present embodiment is not limited thereto.

In more detail, the first lower semiconductor pattern LSP1 may be in direct contact with the substrate 10, as shown in FIG. 5A, and may include a pillar-shaped epitaxial layer that is epitaxially grown from the substrate 10. The first lower semiconductor pattern LSP1 may be formed of or include at least one of silicon (Si), germanium (Ge), silicon-germanium (SiGe), III-V semiconductor compounds, and/or II-VI semiconductor compounds. A gate insulating layer 15 may be provided on a portion of a side surface of the first lower semiconductor pattern LSP1. The gate insulating layer 15 may be provided between the lowermost electrode ELa and the first lower semiconductor pattern LSP1. The gate insulating layer 15 may include a silicon oxide layer (e.g., a thermally-grown oxide layer). The gate insulating layer 15 may have a rounded side surface.

As shown in FIG. 5B, the first lower semiconductor pattern LSP1 may not be provided in the cell vertical structure CVS, and the first upper semiconductor pattern USP1 may be in direct contact with the substrate 10.

The first upper semiconductor pattern USP1 may be in direct contact with the first lower semiconductor pattern LSP1 or the substrate 10 and may have a vertical section that is shaped like a bottom-closed pipe or a letter 'U'. An internal space of the first upper semiconductor pattern USP1 may be filled with a first gap-filling insulating pattern VI that includes an insulating material. The first vertical insulating pattern VP1 may be provided to enclose the first upper semiconductor pattern USP1 and to cover a side surface of the first upper semiconductor pattern USP1.

The first upper semiconductor pattern USP1 may include a semiconductor material (e.g., silicon (Si), germanium (Ge), or mixtures thereof). The first upper semiconductor pattern USP1 may have a different crystal structure from that of the first lower semiconductor pattern LSP1 and may have at least one of, for example, a single-crystalline structure, a poly-crystalline structure, or an amorphous structure.

In some embodiments, the first vertical insulating pattern VP1 may be used as a data storing layer of a NAND FLASH memory device and may include a tunnel insulating layer TIL, a charge storing layer CIL, and a blocking insulating layer BLK. For example, the charge storing layer CIL may be a trap insulating layer, a floating gate electrode, or an insulating layer with conductive nanodots. In detail, the charge storing layer CIL may include at least one of a silicon nitride layer, a silicon oxynitride layer, a silicon-rich nitride layer, a nanocrystalline silicon layer, and/or a laminated trap layer. The tunnel insulating layer TIL may be formed of at least one of materials that have band gaps that are greater than a band gap of the charge storing layer CIL, and the blocking insulating layer BLK may be formed of a high-k dielectric material (e.g., aluminum oxide and hafnium oxide). In certain embodiments, the first vertical insulating pattern VP1 may include a phase-change layer or a variable-resistance layer, which is used as a part of a memory element of a phase-change memory device or variable resistance memory.

The dummy vertical structures DVS may be provided on the connection region CNR and configured to penetrate the planarized insulating layer 50 and the electrode structure ST. The longer the distance between the dummy vertical structure DVS and the cell array region CAR, the smaller the number of the electrodes ELa, ELb, and ELc that the dummy vertical structure DVS penetrates.

As shown in FIG. 2, a plurality of the dummy vertical structures DVS may be provided and configured to penetrate the pad portion ELp of each of the electrodes ELa, ELb, and ELc. The plurality of the dummy vertical structures DVS, which are configured to penetrate the pad portion ELp of each of the electrodes ELa, ELb, and ELc, may be arranged to surround each of cell contact plugs CPLG, when viewed in a plan view. In some embodiments, as shown in FIG. 2, four dummy vertical structures DVS may be provided to penetrate the pad portion ELp of each of the electrodes ELa, ELb, and ELc, but the present embodiment is not limited thereto. In certain embodiments, one, two, three, five, or six dummy vertical structures DVS may be provided to penetrate the pad portion ELp of each of the electrodes ELa, ELb, and ELc. Furthermore, some of the dummy vertical structures DVS may be provided to penetrate at least one of side walls of the electrodes ELa, ELb, and ELc, when viewed in a plan view.

Each of the dummy vertical structures DVS may be provided to have substantially the same stacking structure as the cell vertical structures CVS and may include substantially the same material as the cell vertical structures CVS. In detail, each of the dummy vertical structures DVS may include a second lower semiconductor pattern LSP2, a second upper semiconductor pattern USP2, and a second vertical insulating pattern VP2. The second lower semiconductor pattern LSP2 may include the same material as the first lower semiconductor pattern LSP1 of the cell vertical structure CVS. The second upper semiconductor pattern USP2 may include the same material as the first upper semiconductor pattern USP1 of the cell vertical structure CVS. The second vertical insulating pattern VP2 may include the same material as the first vertical insulating pattern VP1 of the cell vertical structure CVS. For example, the second vertical insulating pattern VP2 may include a tunnel insulating layer, a charge storing layer, and a blocking insulating layer that constitute the data storing layer of the NAND FLASH memory device.

In some embodiments, the dummy vertical structure DVS may have substantially the same vertical length as that of the cell vertical structure CVS and may have a width that is larger than that of the cell vertical structure CVS. For example, top surfaces of the dummy vertical structures DVS may be located at substantially the same level as that of top surfaces of the cell vertical structures CVS.

In more detail, a top surface of each of the dummy vertical structures DVS may have a first length L1 and a first width W1$a$ which is less than the first length L1. In particular, each of the dummy vertical structures DVS may have an elliptical top surface with major and minor axes or a bar-shaped top surface. The dummy vertical structures DVS may be provided in such a way that their major axes have different directions, which are diagonal with respect to the first and second directions D1 and D2. In some embodiments, in the pad portion ELp of each of the electrodes ELa, ELb, and ELc, a space S1 between the dummy vertical structures DVS in the first direction D1 may be larger than a space S2 between the dummy vertical structures in the second direction D2.

The dummy vertical structure DVS may have the first width W1$a$ at the top level thereof and a second width W1$b$, which is smaller than the first width W1$a$, at the bottom level thereof. In certain embodiments, the dummy vertical structure DVS may have a bowing region, which is located between the top and bottom levels and has a third width W1$c$ that is larger than the first and second widths W1$a$ and W1$b$. A distance between the bowing regions of adjacent ones of the dummy vertical structures DVS may be smaller than a distance between the top surfaces of the adjacent ones of the dummy vertical structures DVS.

First and second interlayered insulating layers 60 and 70 may be provided on the planarized insulating layer 50 and arranged to cover the top surfaces of the cell and dummy vertical structures CVS and DVS. In some embodiments, the first interlayered insulating layer 60 may be arranged to cover top surfaces of the bit line contact pads BLPAD.

Bit line contact plugs BPLG may be provided on the cell array region CAR and configured to penetrate the first and second interlayered insulating layers 60 and 70, thereby being respectively coupled to the cell vertical structures CVS.

Cell contact plugs CPLG may be provided on the connection region CNR and configured to penetrate the first and second interlayered insulating layers 60 and 70 and the planarized insulating layer 50, thereby being respectively coupled to the pad portions ELp of the electrodes ELa, ELb, and ELc. The smaller the distance to the cell array region CAR, the smaller the vertical lengths of the cell contact plugs CPLG. In addition, the cell contact plugs CPLG may have top surfaces that are substantially coplanar with each other.

When viewed in a plan view, each of the cell contact plugs CPLG may be surrounded by a corresponding subset of the dummy vertical structures DVS. For example, each of the cell contact plugs CPLG may be placed between adjacent ones of the dummy vertical structures DVS.

In some embodiments, the top surface of each of the cell contact plugs CPLG may have a second length L2 and a second width W2 which is smaller than the second length L2. For example, each of the cell contact plugs CPLG may have an elliptical top surface with major and minor axes or a bar-shaped top surface. In this aspect, the second length L2 of the cell contact plug CPLG may be larger than the space S2 between the dummy vertical structures DVS, which are arranged to be adjacent to each other in the second direction D2. Furthermore, the second length L2 may be smaller than a diagonal distance d between the dummy vertical structures DVS in each of the pad portions ELp. In addition, the cell contact plugs CPLG may be provided in such a way that their major axes are oriented to be parallel to the second direction D2. Since the top surface of the cell contact plug CPLG is elliptical in shape, it may be possible to meet technical requirements for the minimum distance between the cell contact plug CPLG and the dummy vertical structures DVS adjacent thereto.

Common source regions CSR may be formed by doping portions of the substrate 10 between the electrode structures ST with second conductivity type impurities. The common source regions CSR may extend in a direction that is parallel to the electrode structures ST or in the first direction D1. The common source regions CSR may include, for example, n-type impurities (e.g., arsenic (As) or phosphorus (P)).

Common source plugs CSP may be provided between the electrode structures ST and may be respectively coupled to corresponding ones of the common source regions CSR. As an example, the common source plug CSP may be provided to extend in the first direction D1 and to have a substantially uniform top width.

Insulating spacers SP may be interposed between side surfaces of the common source plugs CSP and the electrode structures ST. In certain embodiments, the common source plug CSP may be provided and configured to penetrate the insulating spacer SP and may be locally connected to a portion of the common source region CSR.

Bit lines BL and connection lines CL may be provided on the second interlayered insulating layer 70. The bit lines BL may be provided on the cell array region CAR, and the connection lines CL may be provided on the connection region CNR.

The bit lines BL may be provided to cross the electrode structures ST or to extend in the second direction D2 and may be coupled to the bit line contact pads BLPAD through the bit line contact plugs BPLG. The connection lines CL may be connected to the cell contact plugs CPLG.

Figure 6:
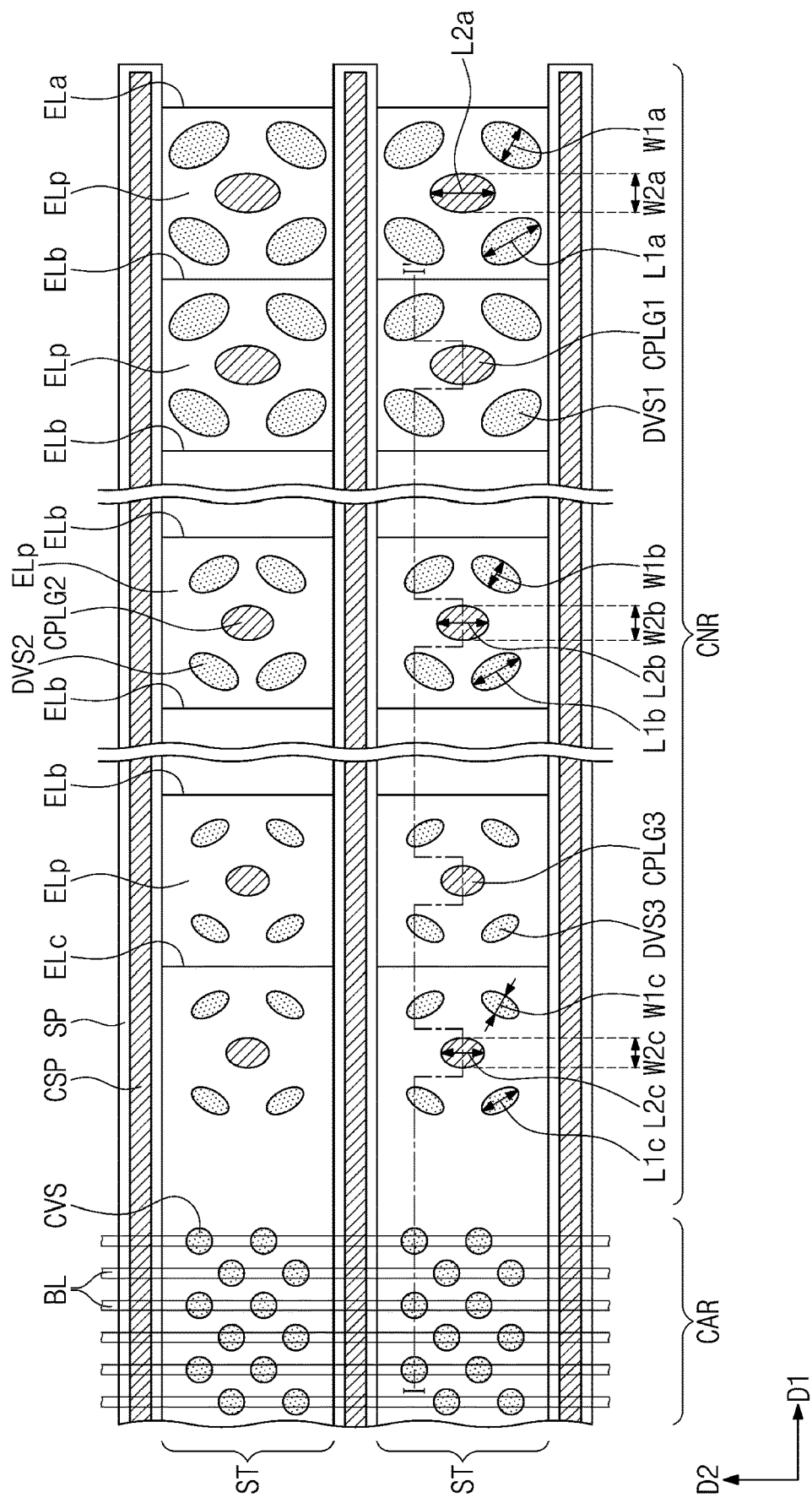
FIG. 6 is a plan view illustrating a three-dimensional semiconductor memory device, according to some embodiments.
Figure 7:
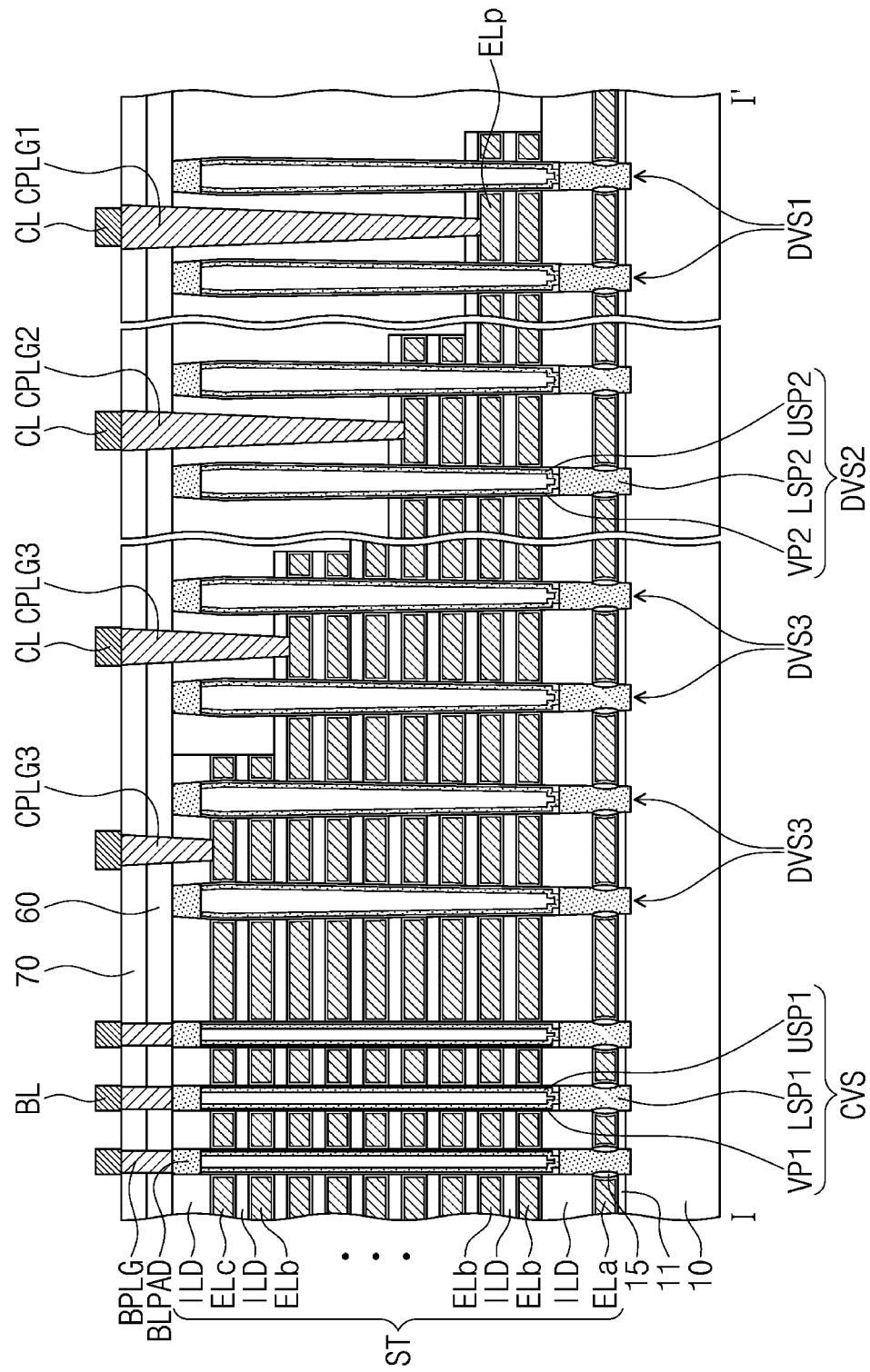
FIG. 7 is a sectional view taken along line I-I' of FIG. 6.

FIG. 6 is a plan view illustrating a three-dimensional semiconductor memory device, according to some embodiments. FIG. 7 is a sectional view taken along line I-I' of FIG. 6. For concise description, an element previously described with reference to FIGS. 2, 3, 4, 5A, and 5B may be identified by the same reference number without repeating a duplicative description thereof.

Referring to FIGS. 6 and 7, the electrode structure ST may include a lower region, an intermediate region, and an upper region, which are sequentially stacked in a direction that is perpendicular to the top surface of the substrate 10. Some of the electrodes (e.g., ELa and ELb) may be provided at the lower region of the electrode structure ST and arranged to form a lower staircase structure, and others of the electrodes (e.g., ELb) may be provided at the intermediate region of the electrode structure ST and arranged to form an intermediate staircase structure. Others of the electrodes (e.g., ELb and ELc) may be provided at the upper region of the electrode structure ST and arranged to form an upper staircase structure.

The dummy vertical structures may include first dummy vertical structures DVS1, which are configured to penetrate the lower staircase structure of the electrode structure ST, second dummy vertical structures DVS2, which are configured to penetrate the intermediate staircase structure of the electrode structure ST, and third dummy vertical structures DVS3, which are configured to penetrate the upper staircase structure of the electrode structure ST. Each of the first, second, and third dummy vertical structures DVS1, DVS2, and DVS3 may be provided to have an elliptical top surface or a bar-shaped top surface, as described above.

In the present embodiments, the dummy vertical structures DVS1, DVS2, and DVS3 may be provided to have lengths and widths that increase with increasing distance from the cell array region CAR (i.e., L1a>L1b>L1c and W1a>W1b>W1c). Similarly, cell contact plugs CPLG1, CPLG2, and CPLG3 may also be provided to have lengths and widths that increase with increasing distance from the cell array region CAR (i.e., L2a>L2b>L2c and W2a>W2b>W2c).

In detail, the first dummy vertical structures DVS1 may be provided to have a width W1a and a length L1a, the second dummy vertical structures DVS2 may be provided to have a width W1b and a length L1b, which are respectively smaller than the width W1a and the length L1a of the first dummy vertical structures DVS1, and the third dummy vertical structures DVS3 may be provided to have a width W1c and a length L1c, which are respectively smaller than the width W1b and the length L1b of the second dummy vertical structures DVS2. In this aspect, the width W1a and the length L1a of the first dummy vertical structure DVS1, which is spaced apart from the cell array region CAR by a first distance, may be larger than the width W1c and the length L1c of the third dummy vertical structure DVS3, which is spaced apart from the cell array region CAR by a second distance that is less than the first distance.

The cell contact plugs CPLG1, CPLG2, and CPLG3 may be coupled to the pad portions ELp of the electrodes ELa, ELb, and ELc, respectively. The cell contact plugs may include first cell contact plugs CPLG1, which are coupled to the electrodes ELa and ELb provided at the lower region of the electrode structure ST, second cell contact plugs CPLG2, which are coupled to the electrodes ELb provided at the intermediate region of the electrode structure ST, and third cell contact plugs CPLG3, which are coupled to the electrodes ELb and ELc provided at the upper region of the electrode structure ST.

In particular, the cell contact plugs may include the first cell contact plug CPLG1, which is spaced apart from the cell array region CAR by a first distance, the second cell contact plug CPLG2, which is spaced apart from the cell array region CAR by a second distance that is less than the first distance, and the third cell contact plug CPLG3, which is spaced apart from the cell array region CAR by a third distance that is less than the second distance. In other words, the third cell contact plugs CPLG3 may be closer to the cell array region than the first and second cell contact plugs CPLG1 and CPLG2.

The width W2a and the length L2a of the first cell contact plug CPLG1 may be larger than the width W2b and the length L2b of the second cell contact plug CPLG2, and the width W2b and the length L2b of the second cell contact plug CPLG2 may be larger than the width W2c and the length L2c of the third cell contact plug CPLG3.

FIGS. 8 to 15 are plan views illustrating various examples of three-dimensional semiconductor memory devices, according to some embodiments. For concise description, a previously-described element may be identified by the same reference number without repeating a duplicative description thereof.

Figure 8:
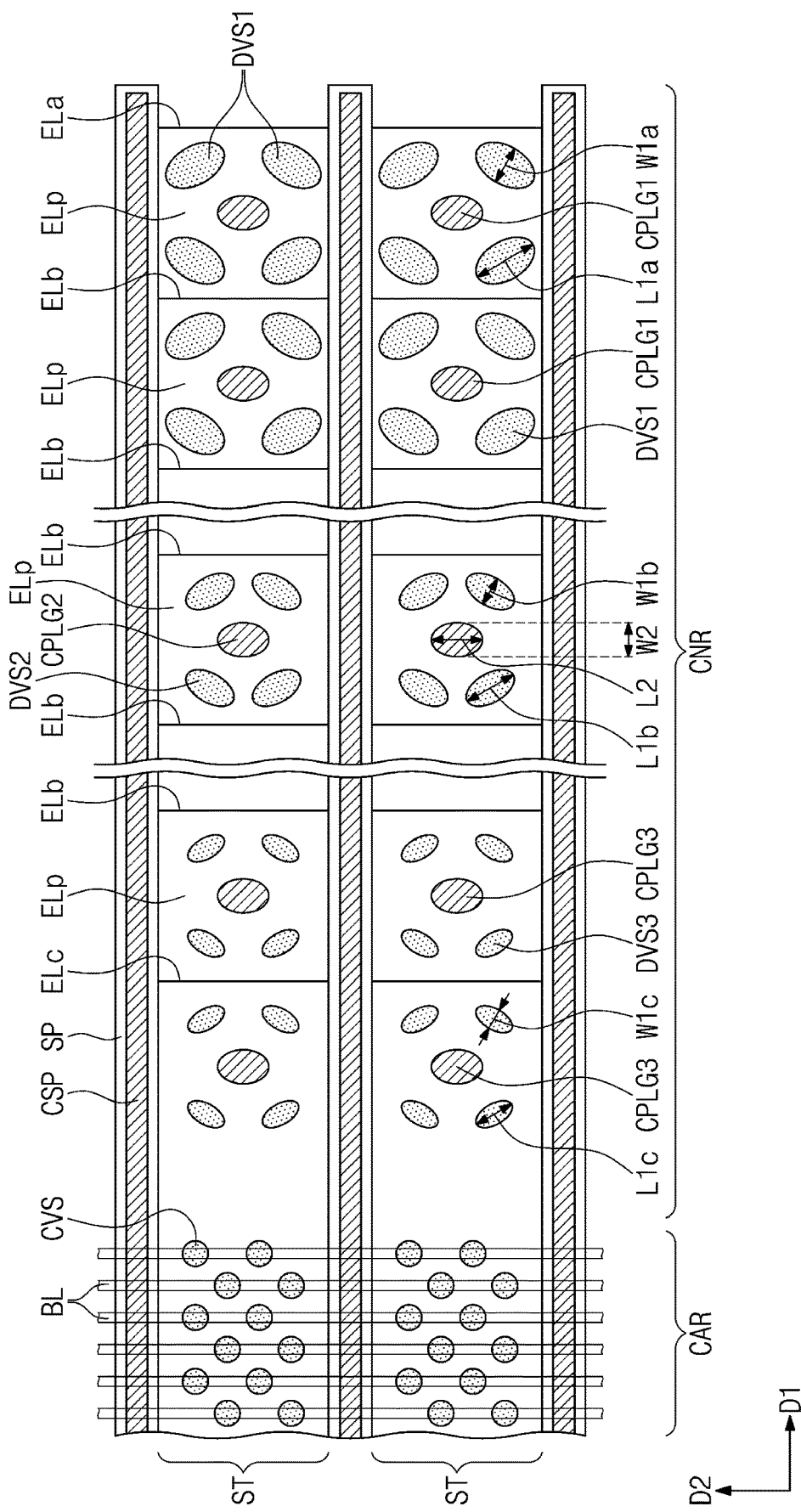
FIGS. 8 to 15 are plan views illustrating various examples of three-dimensional semiconductor memory devices, according to various embodiments.

In some embodiments, as shown in FIG. 8, the dummy vertical structures DVS1, DVS2, and DVS3 may be provided to have lengths and widths that increase with increasing distance from the cell array region CAR (i.e., L1a>L1b>L1c and W1a>W1b>W1c). However, the cell contact plugs CPLG1, CPLG2, and CPLG3 may be provided to have substantially the same length and width (i.e., L2 and W2).

Figure 9:
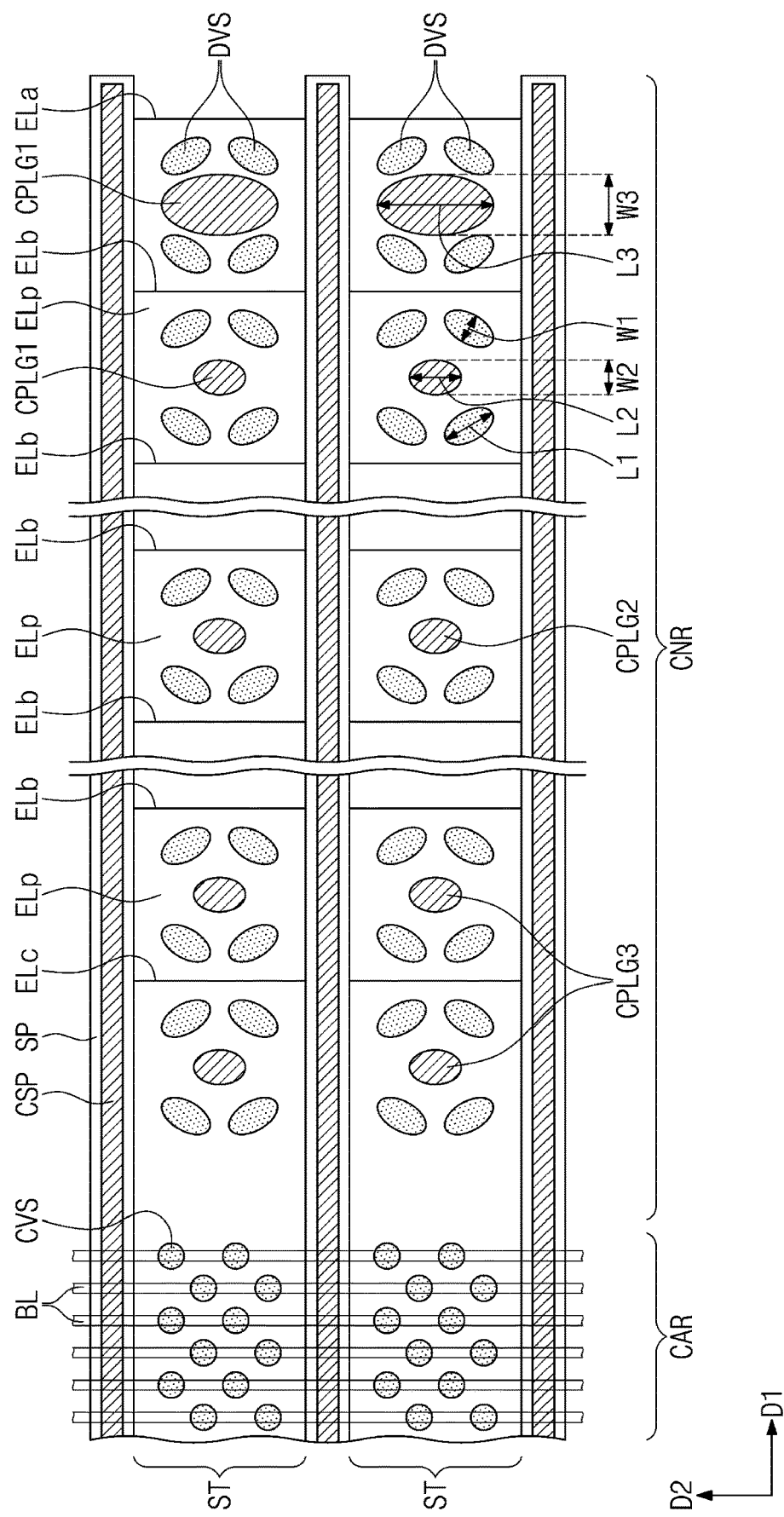

In some embodiments, as shown in FIG. 9, the dummy vertical structures DVS may be provided to have substantially the same length and width (e.g., L1 and W1).

The first cell contact plug CPLG1, which is coupled to the lowermost electrode Ela, may be provided to have a width W3 and a length L3, and others cell contact plugs (e.g., CPLG2 and CPLG3) may be provided to have substantially the same length and width (e.g., L2 and W2), which are respectively less than the width and length W3 and L3 of the first cell contact plug CPLG1.

Figure 10:
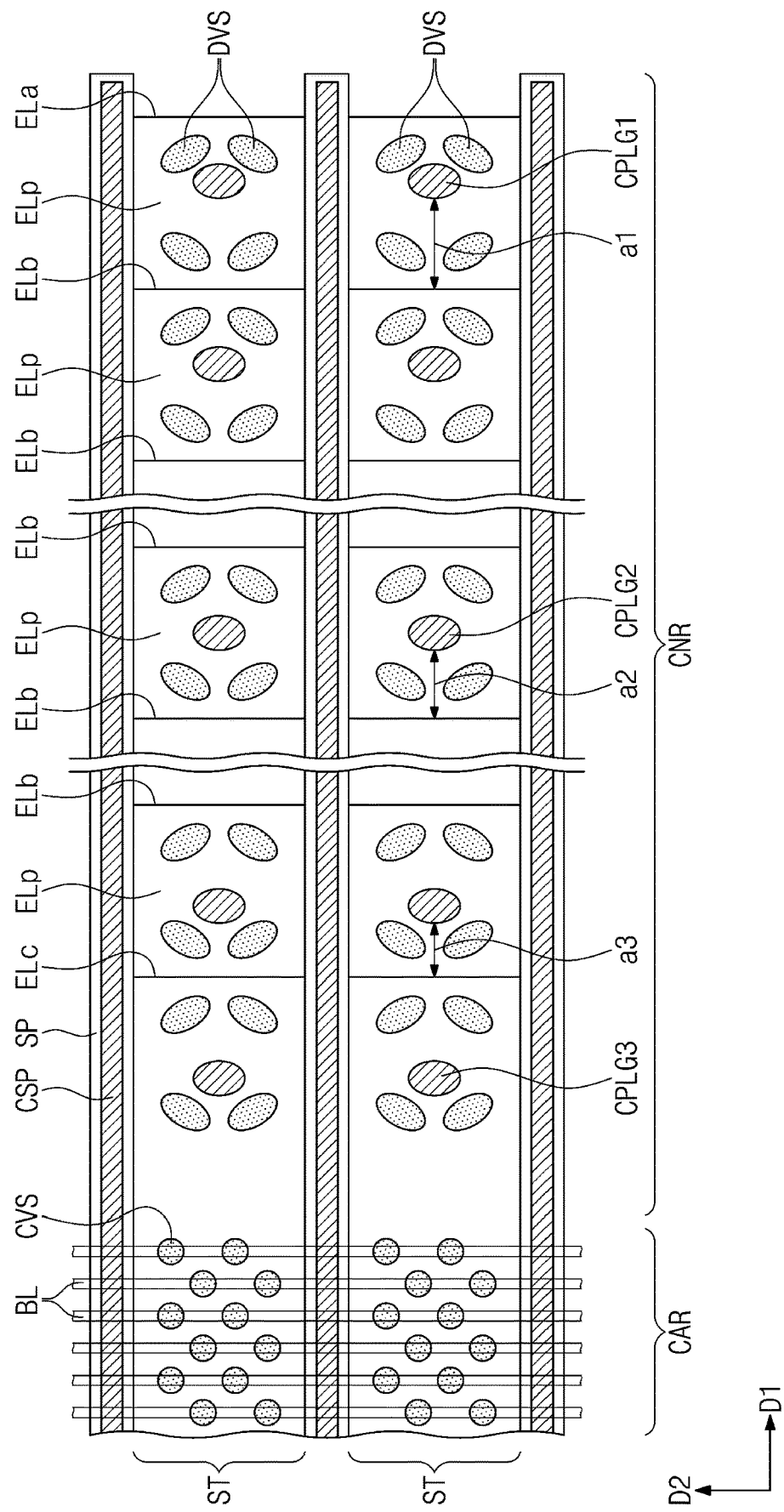

In some embodiments, as shown in FIG. 10, the cell contact plugs CPLG1, CPLG2, and CPLG3 may be spaced apart from side surfaces of the electrodes ELa, ELb, and ELc by different distances a1, a2, and a3. For example, the first cell contact plugs CPLG1 may be spaced apart from the side surfaces of the pad portions ELp that are adjacent thereto by a first distance a1. The second cell contact plugs CPLG2 may be spaced apart from the side surfaces of the pad portions ELp that are adjacent thereto by a second distance a2 that is less than the first distance a1. The third cell contact plugs CPLG3 may be spaced apart from the side surfaces of the pad portions ELp that are adjacent thereto by a third distance a3 that is less than the second distance a2.

In some embodiments, the cell contact plugs CPLG may have an elliptical or bar-shaped top surface, and a major or long axis of the top surface of each of the cell contact plugs CPLG may be parallel to one of the first direction D1, the second direction D2 which is perpendicular to the first direction D1, and directions that are diagonal with respect to the first and second directions D1 and D2. In this aspect, each of the first and second directions D1 and D2 and the diagonal directions may be parallel to the top surface of the substrate 10.

Figure 11:
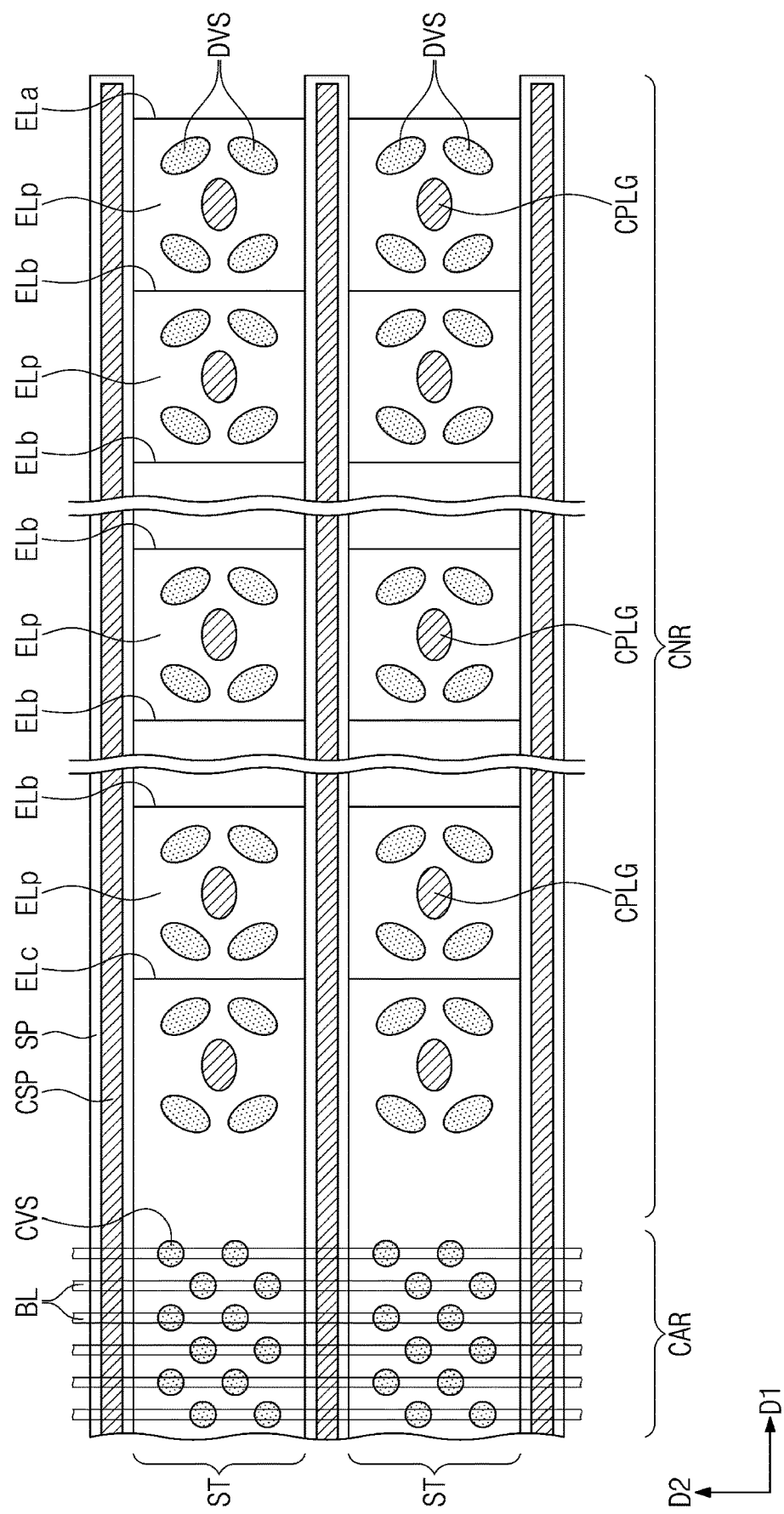

In some embodiments, as shown in FIG. 11, the cell contact plugs CPLG may have an elliptical or bar-shaped top surface, and a major or long axis of the top surface of each of the cell contact plugs CPLG may be parallel to an extension direction (i.e., the first direction D1) of the electrode structure ST.

Figure 12:
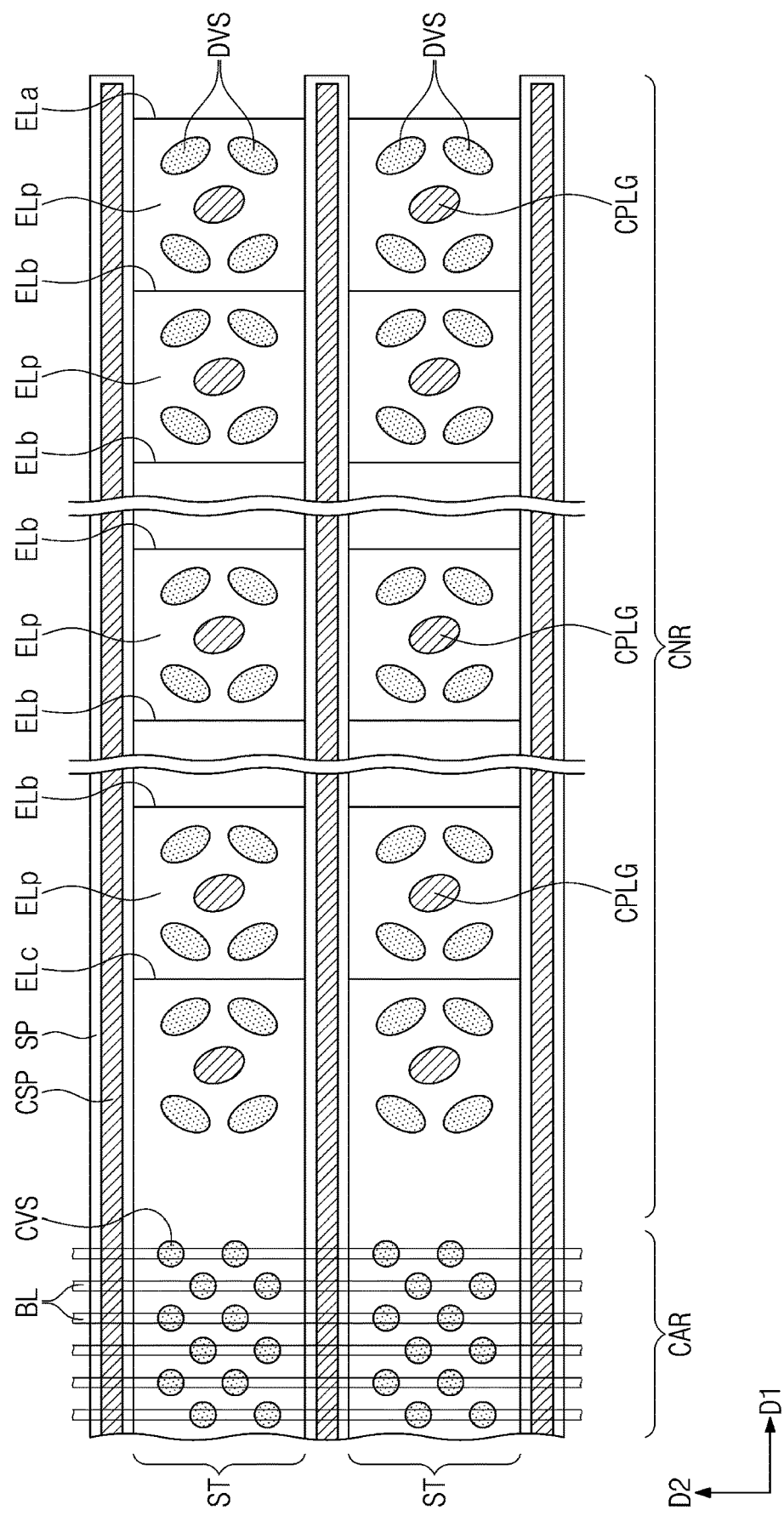

In certain embodiments, as shown in FIG. 12, a major or long axis of the top surface of each of the cell contact plugs CPLG may be parallel to one of the directions that is diagonal with respect to the first direction D1 and the second direction D2. Furthermore, the major axes of the cell contact plugs CPLG may be parallel to each other. As an example, the major axes of the cell contact plugs CPLG may be at an angle of about 15° to 30° with respect to the first or second direction D1 or D2.

Figure 13:
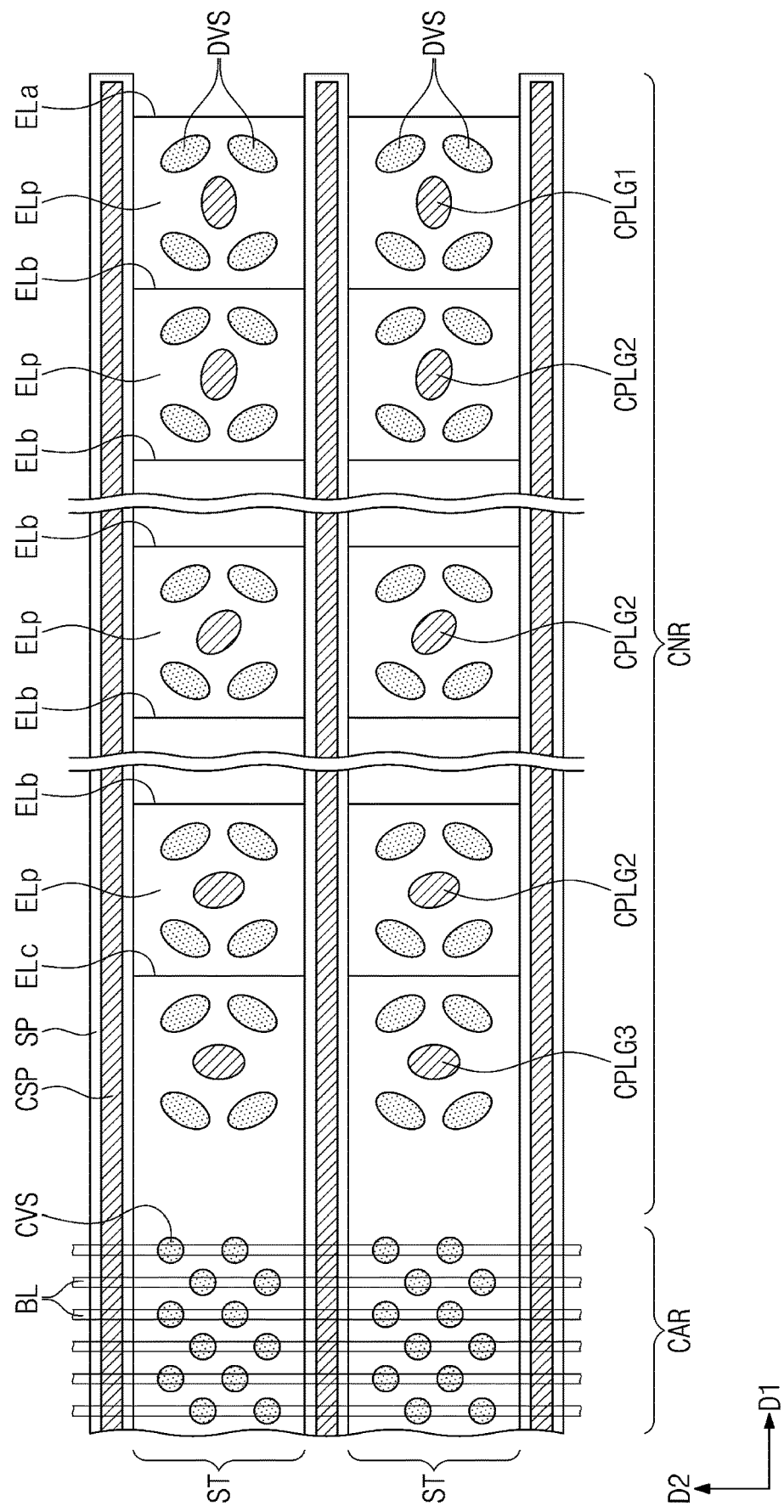

In some embodiments, as shown in FIG. 13, the major axes of the cell contact plugs CPLG may be oriented in directions that are different from each other. For example, the major axis of the first cell contact plug CPLG1, which is coupled to the lowermost electrode Ela, may be parallel to the first direction D1, and the major axis of the third cell contact plug CPLG3, which is coupled to the uppermost electrode ELc, may be parallel to the second direction D2.

The major axes of the second cell contact plugs CPLG2, which are coupled to other electrodes ELb between the uppermost and lowermost electrodes ELc and Ela, may have at least two different directions that are diagonal with respect to the first and second directions D1 and D2. In other words, the second cell contact plugs CPLG2 may have major axes that are inclined at different angles (e.g., between 0° and 90° relative to the first and second directions D1 and D2.

Figure 14:
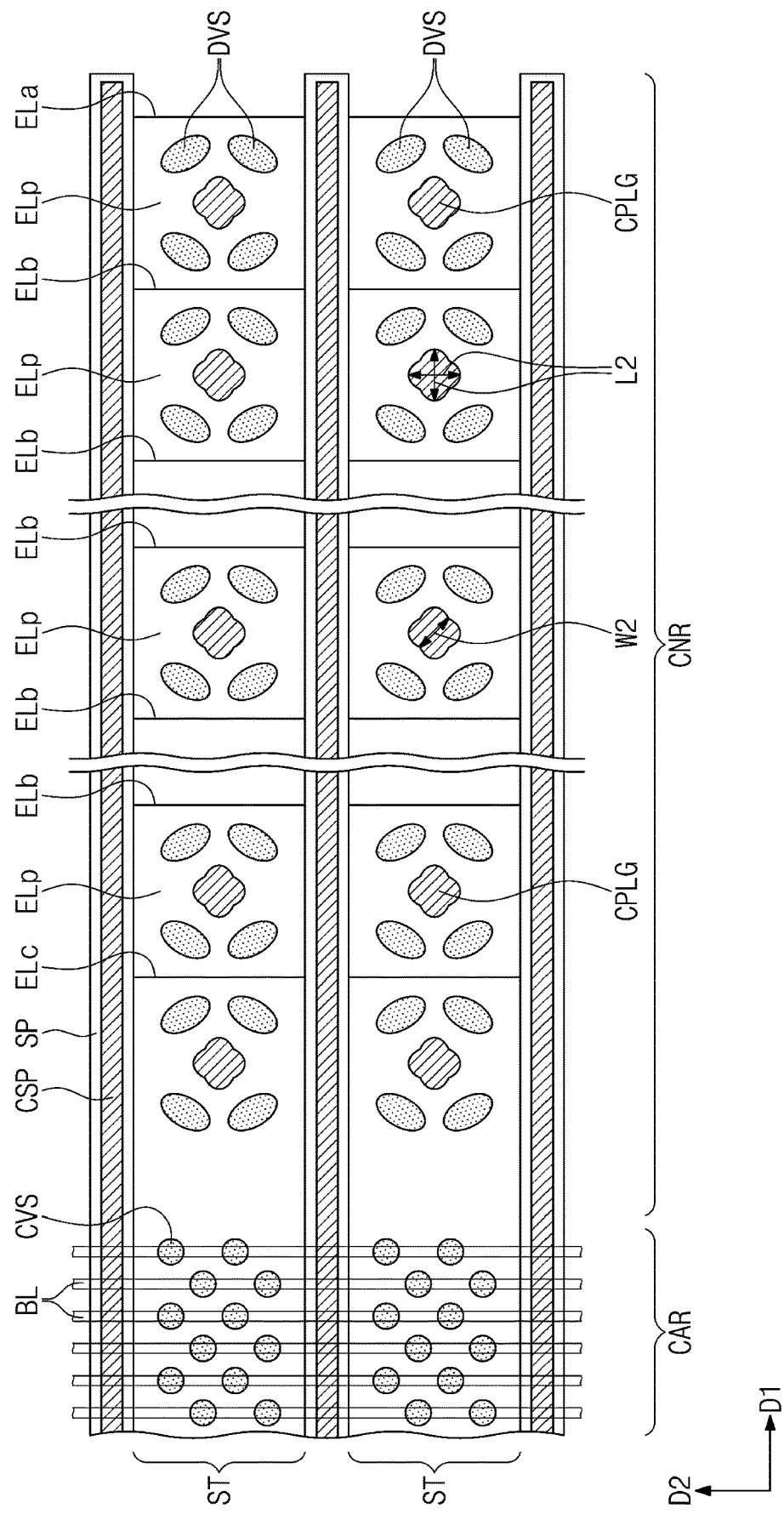
Figure 15:
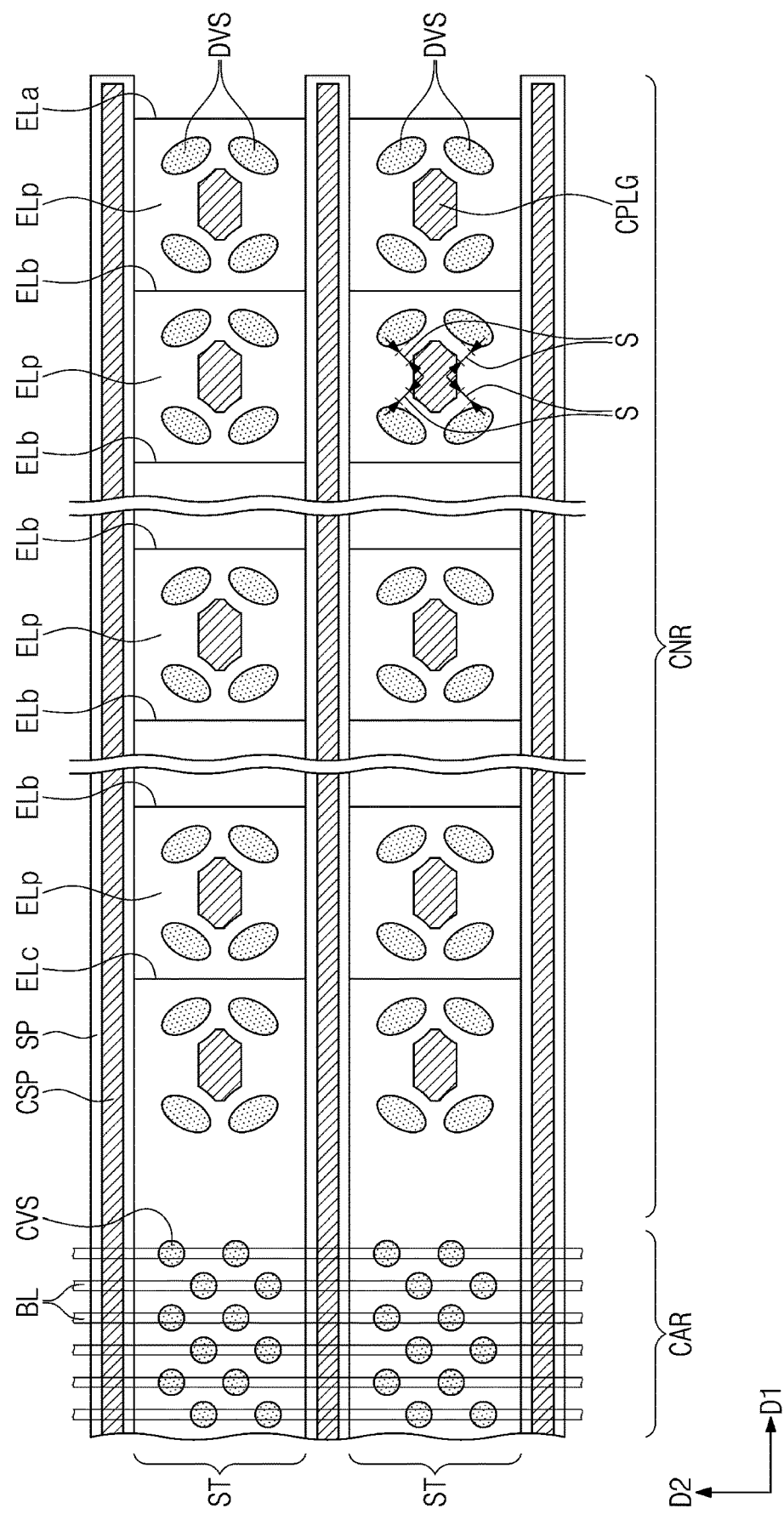

In some embodiments, as shown in FIGS. 14 and 15, at least one of the cell contact plugs CPLG may be provided to have a polygonal top surface.

As an example, as shown in FIG. 14, each of the cell contact plugs CPLG may be provided to have the longest width (e.g., L2) in the first and second directions D1 and D2 and to have the shortest width (e.g., W2) in the diagonal direction. Accordingly, it may be possible to increase a distance between each of the cell contact plugs CPLG and the dummy vertical structures DVS in this manner.

As shown in FIG. 15, each of the cell contact plugs CPLG may be provided to be spaced apart from neighboring ones of the dummy vertical structures DVS by substantially the same distance. Accordingly, it may be possible to increase distances S between each of the cell contact plugs CPLG and the neighboring ones of the dummy vertical structures DVS.

According to some embodiments of the present inventive concept, not only dummy vertical structures but also cell contact plugs are provided on a connection region to have an elliptical or bar-shaped top surface. Accordingly, it is possible to meet technical requirements for a minimum distance between the cell contact plug and the dummy vertical structures adjacent thereto. Thus, it is possible to prevent an electric short circuit from being formed between the cell contact plug and the dummy vertical structures and thereby to improve reliability and electric characteristics of a three-dimensional semiconductor memory device.

While example embodiments of the present inventive concepts have been particularly shown and described, it will be understood by one of ordinary skill in the art that variations in form and detail may be made therein without departing from the spirit and scope of the attached claims.

What is claimed is:

1. A three-dimensional semiconductor memory device, comprising:
a substrate including a cell array region and a connection region;
an electrode structure provided on a top surface of the substrate to extend in a first direction and to include electrodes that are vertically stacked on the substrate, each of the electrodes comprising a respective pad portion from among a plurality of pad portions which are stacked on the connection region to form a staircase structure;
a plurality of cell vertical structures provided on the cell array region and configured to penetrate the electrode structure;
a plurality of dummy vertical structures provided on the connection region and configured to penetrate the respective pad portion of each of the electrodes; and
a plurality of cell contact plugs, each of the plurality of cell contact plugs being coupled to a corresponding one from among the plurality of pad portions,
wherein a top surface of each of the plurality of cell contact plugs is substantially parallel to the top surface of the substrate, has a first length and a first width that is less than the first length, and
a respective subset of the plurality of dummy vertical structures is arranged to surround a corresponding one of the plurality of cell contact plugs, when viewed in a plan view.

2. The three-dimensional semiconductor memory device of claim 1, wherein the top surface of each of the plurality of cell contact plugs has a major axis that is parallel to one from among the first direction and a second direction that is different from the first direction.

3. The three-dimensional semiconductor memory device of claim 1, wherein a minimum distance between adjacent ones of the plurality of dummy vertical structures is less than the first width of the top surface of each of the plurality of cell contact plugs.

4. The three-dimensional semiconductor memory device of claim 1, wherein the first length of the top surface of each of the plurality of cell contact plugs is less than a distance between adjacent ones of the plurality of dummy vertical structures, which are arranged adjacent to each other in a direction that is diagonal with respect to the first direction.

5. The three-dimensional semiconductor memory device of claim 1, wherein each of the plurality of dummy vertical structures has an upper width at a top level thereof, a lower width at a bottom level thereof, and an intermediate width at a bowing region between the top level thereof and the bottom level thereof, and
the lower width is less than the upper width and the intermediate width is larger than the upper width.

6. The three-dimensional semiconductor memory device of claim 1, wherein each of the plurality of dummy vertical structures has a width that is larger than a width of each of the plurality of cell vertical structures.

7. The three-dimensional semiconductor memory device of claim 1, wherein each of the plurality of cell contact plugs and each of the plurality of dummy vertical structures has an elliptical top surface.

8. The three-dimensional semiconductor memory device of claim 7, wherein the top surface of each of the plurality of dummy vertical structures has a major axis that is disposed diagonally with respect to the first direction.

9. A three-dimensional semiconductor memory device comprising:
a substrate including a cell array region and a connection region;
an electrode structure provided on the substrate to extend in a first direction and to include electrodes that are vertically stacked on the substrate, each of the electrodes comprising a respective pad portion from among a plurality of pad portions which are stacked on the connection region to form a staircase structure;
a plurality of cell vertical structures provided on the cell array region and configured to penetrate the electrode structure;
a plurality of dummy vertical structures provided on the connection region and configured to penetrate the respective pad portion of each of the electrodes; and
a plurality of cell contact plugs, each of the plurality of cell contact plugs being coupled to a corresponding one from among the plurality of pad portions,
wherein a top surface of each of the plurality of cell contact plugs has a first length and a first width that is less than the first length, and
a respective subset of the plurality of dummy vertical structures is arranged to surround a corresponding one of the plurality of cell contact plugs, when viewed in a plan view, wherein each of the plurality of dummy vertical structures has an elliptical top surface, and wherein the top surface of each of the plurality of dummy vertical structures has a major axis that is oriented in a direction that is different from a direction of orientation of the top surface of others of the plurality of dummy vertical structures.

10. The three-dimensional semiconductor memory device of claim 1, wherein each of the plurality of dummy vertical structures is spaced apart from side surfaces of the electrodes.

11. The three-dimensional semiconductor memory device of claim 1, wherein each of the plurality of cell vertical structures and each of the plurality of dummy vertical structures comprises a respective semiconductor pattern, which extends in a direction that is perpendicular to the top surface of the substrate, and a respective data storage pattern, which is provided to surround a side surface of the respective semiconductor pattern.

12. A three-dimensional semiconductor memory device, comprising:

a substrate including a cell array region and a connection region;

an electrode structure provided on a top surface of the substrate to extend in a first direction and to include electrodes that are vertically stacked on the substrate, each of the electrodes comprising a respective pad portion from among a plurality of pad portions which are stacked on the connection region to form a staircase structure;

a plurality of cell vertical structures provided on the cell array region and configured to penetrate the electrode structure;

a plurality of cell contact plugs, each of the plurality of cell contact plugs being coupled to a corresponding one from among the plurality of pad portions, a top surface of each of the plurality of cell contact plugs being substantially parallel to the top surface of the substrate, and having a first length and a second width that less than the first length; and a plurality of dummy vertical structures provided on the connection region and configured to penetrate the respective pad portion of each of the electrodes such that a respective subset of the plurality of dummy vertical structures is arranged to surround a corresponding one of the plurality of cell contact plugs, wherein the plurality of dummy vertical structures comprises a first dummy vertical structure, which is spaced apart from the cell array region by a first distance, and a second dummy vertical structure, which is spaced apart from the cell array region by a second distance that is larger than the first distance, and a width of the second dummy vertical structure is larger than a width of the first dummy vertical structure.

13. The three-dimensional semiconductor memory device of claim 12, wherein the top surface of each of the plurality of cell contact plugs has a major axis that is parallel to one from among the first direction, a second direction crossing the first direction, and one of directions that is diagonal with respect to one of the first direction and the second direction.

14. The three-dimensional semiconductor memory device of claim 12, wherein each of the plurality of cell contact plugs and each of the plurality of dummy vertical structures has an elliptical top surface.

15. The three-dimensional semiconductor memory device of claim 14, wherein a length of a major axis of the elliptical top surface of each of the plurality of dummy vertical structures is less than the first length of the top surface of each of the plurality of cell contact plugs.

16. The three-dimensional semiconductor memory device of claim 12, wherein a minimum distance between adjacent ones of the plurality of dummy vertical structures is less than the second width of the top surface of each of the plurality of cell contact plugs.

17. The three-dimensional semiconductor memory device of claim 12, wherein each of the plurality of dummy vertical structures includes a bowing region having a width that is larger than each of a top width and a bottom width of each of the plurality of dummy vertical structures.

18. The three-dimensional semiconductor memory device of claim 12, wherein each of the plurality of dummy vertical structures is spaced apart from side surfaces of the electrodes.

19. The three-dimensional semiconductor memory device of claim 12, wherein each of the plurality of cell vertical structures has a width that is less than a width of the first dummy vertical structure.

20. The three-dimensional semiconductor memory device of claim 12, wherein each of the plurality of cell vertical structures and each of the plurality of dummy vertical structures comprises a respective semiconductor pattern, which extends in a direction perpendicular to the top surface of the substrate, and a respective data storage pattern, which is provided to surround a side surface of the respective semiconductor pattern.

\* \* \* \* \*